United States Patent
Tsai et al.

(10) Patent No.: US 8,335,119 B1
(45) Date of Patent: Dec. 18, 2012

(54) METHOD OF INSPECTING MEMORY CELL

(75) Inventors: Tzu-Ching Tsai, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/276,952

(22) Filed: Oct. 19, 2011

(51) Int. Cl.
*G11C 7/00* (2006.01)

(52) U.S. Cl. .................. 365/201; 365/149; 365/63

(58) Field of Classification Search .......... 365/201, 365/149, 177, 63, 189.07; 257/296, 300, 257/301
See application file for complete search history.

(56) References Cited

U.S. PATENT DOCUMENTS
7,301,796 B1 * 11/2007 Voogel et al. .............. 365/149

* cited by examiner

*Primary Examiner* — David Lam

(57) ABSTRACT

A method of inspecting a memory cell is provided, including: providing a semiconductor substrate with a capacitor formed therein and a transistor formed thereon, wherein the transistor is electrically connected to the capacitor; inspecting a size of a top surface of the capacitor and a pitch between the capacitor and the transistor electrically connected thereto by an optical measuring system, thereby obtaining a first measurement data and a second measurement data; and comparing the first and second measurement data with designed specifications of the capacitor and transistor, thereby determining functionality of the memory cell comprising the capacitor and the transistor.

12 Claims, 5 Drawing Sheets

METHOD OF INSPECTING MEMORY CELL

BACKGROUND OF THE INVENTION

1. Field of the Invention

The present invention relates to inspection techniques for semiconductor devices, and in particular to a method of inspecting a memory cell of a dynamic random access memory (DRAM) device.

2. Description of the Related Art

A dynamic random access memory (DRAM) device is a kind of a volatile memory device. Digital data storage in a DRAM device is executed by charges and discharges of a capacitor in the DRAM device. When power supplied to the DRAM device is turned off, the data stored in the memory cell of the DRAM device completely disappears. A memory cell in the DRAM device typically includes at least one field effect transistor (FET) and one capacitor. The capacitor is used for storing signals in the cells of the DRAM device.

Off-state currents ($I_{off}$) often happen in memory cells of a DRAM device such that functionality of the memory cells is affected and the fabrication yield of the DRAM device comprising the same is reduced. Therefore, electrical measurements are typically performed to inspect various electrical characteristics of memory cells of the DRAM device. However, these electrical measurements are typically performed after formations of the interconnecting contacts and bitlines thereof, which are later formed after formation of the transistors and the capacitors such that in-time inspection of functionality of the memory cells is not achieved and fabrication costs are increased.

BRIEF SUMMARY OF THE INVENTION

Thus, a method of inspecting a memory cell is provided for in-time inspecting memory cells of, for example, a dynamic random access memory (DRAM) device.

An exemplary method of inspecting a memory cell comprises: providing a semiconductor substrate with a capacitor formed therein and a transistor formed thereon, wherein the transistor is electrically connected to the capacitor; inspecting a size of a top surface of the capacitor and a pitch between the capacitor and the transistor electrically connected thereto by an optical measuring system, thereby obtaining a first measurement data and a second measurement data; and comparing the first and second measurement data with designed specifications of the capacitor and transistor, thereby determining functionality of the memory cell comprising the capacitor and the transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
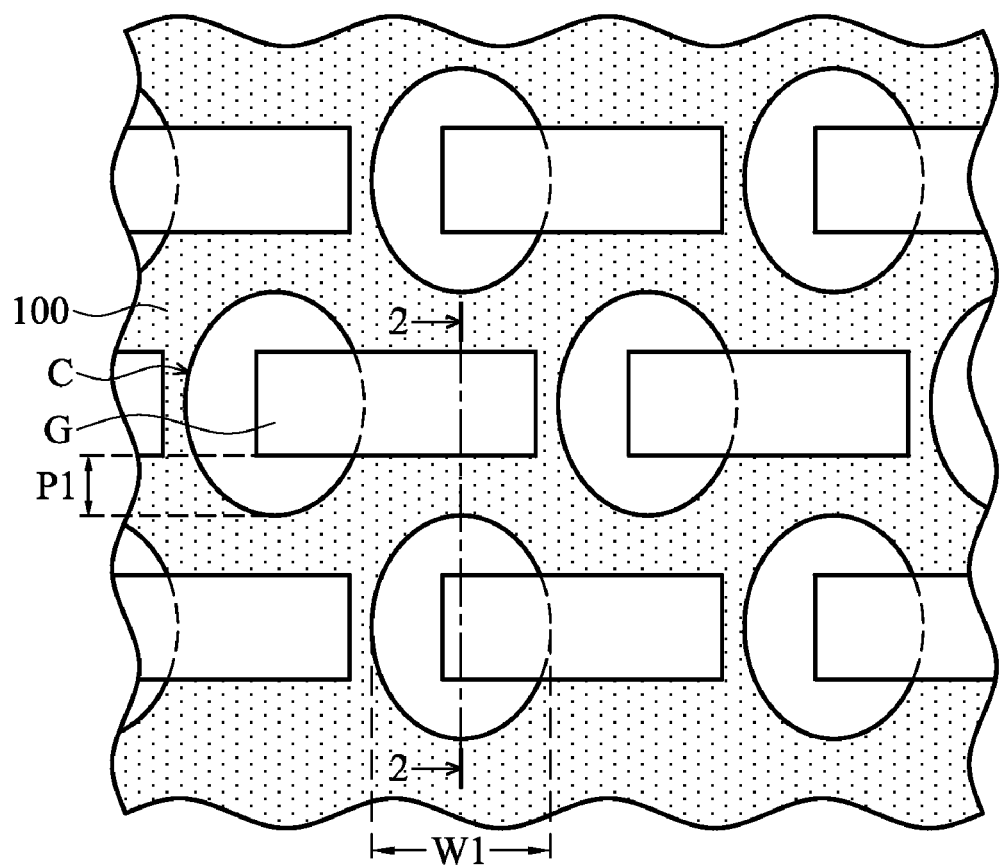
FIG. 1 is a schematic top view showing a layout of a memory cell array of a dynamic random access memory (DRAM) device according to an embodiment of the invention.

FIG. 1 is a schematic top view showing a layout of an exemplary memory cell array of a dynamic random access memory (DRAM) device. As shown in FIG. 1, the layout of the memory cell array comprises a plurality of capacitors C and a plurality of gate stacks G which are periodically provided in and over a semiconductor substrate 100. The capacitors C are deep trench (DT) capacitors formed in the semiconductor substrate 100, and the gate stacks G belong to a plurality of transistors 150 (shown in FIG. 2) which are formed over a top surface of the semiconductor substrate 100 and partially cover a top surface of one of the capacitors C adjacent thereto, respectively. At this time, the entire top surface of the gate stacks G and portions of the top surface of the capacitors C are exposed, and no additional layer is formed thereover.

Figure 2:
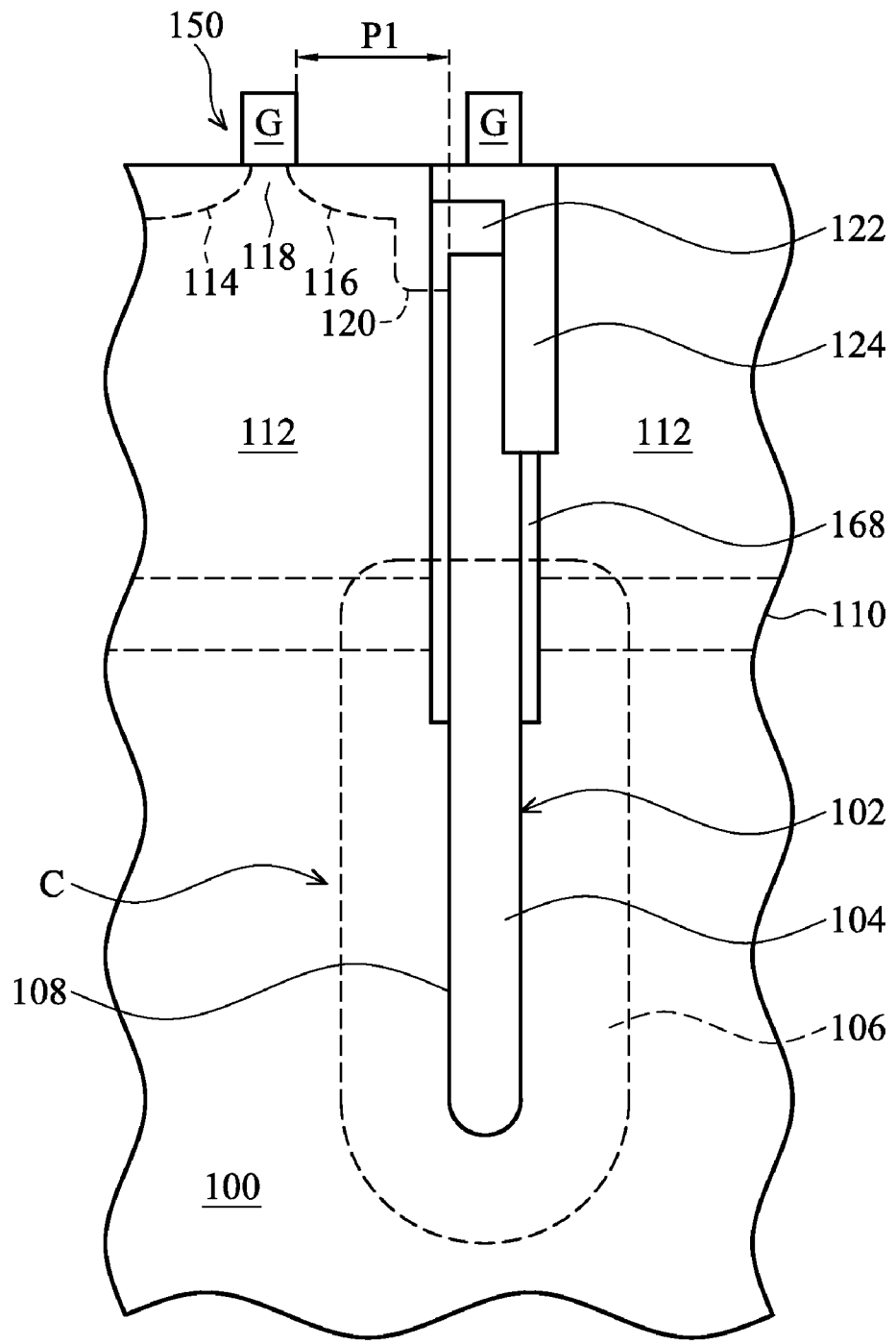
FIG. 2 is a cross sectional view taken along line 2-2 in FIG. 1.

FIG. 2 is a cross sectional view taken along line 2-2 in FIG. 1, showing components of one of the capacitors C and two of the gate stacks G which are respectively formed thereover and adjacent thereto. As shown in FIG. 2, the semiconductor substrate 100 can be, for example, a silicon substrate and is doped with, for example, P-type dopants. The capacitor C includes a trench 102 etched deeply into the semiconductor substrate 100, and an N-type doped polysilicon 104 that fills the trench. The N-type doped polysilicon 104 serves as a top electrode (storage electrode). An N-type doped region 106 covers the bottom of the trench 102 and serves as a bottom electrode. The N-type doped region 106 is also referred to as a buried plate. A dielectric layer 108 insulates the buried plate 106 and the N-type doped polysilicon 104. A buried N-type well 110 isolates a P-type well 112 from the substrate 100 and serves as a conduction bridge connecting the N-type doped region 106. A memory cell includes a transistor 150 and the capacitor C shown in FIG. 2. The transistor 150 includes the left one gate stack G and diffusion regions 114 and 116. Each of the gate stack G may comprise film layers such as a gate dielectric layer (not shown), a gate electrode layer (not shown), and a mask layer (not shown), and the diffusion regions 114 and 116 separated by a channel 118 are formed by implanting of N-type dopants, such as phosphorous (P). A node diffusion region 120, also referred to as a node junction, couples the capacitor C to the transistor 150. The node diffusion region 120 is formed by out diffusion of dopants from the N-type doped polysilicon 104 that fills the trench 102 via a buried strap 122. In addition, a shallow trench isolation (STI) 124 is provided to insulate the memory cell from another cell or device. As illustrated in FIG. 2, another gate stack G is formed on a top portion of the capacitor C and is insulated by the STI 124. The right one gate stack G shown in FIG. 2 belongs to another memory cell and is also known as a passing word line.

Figure 3:
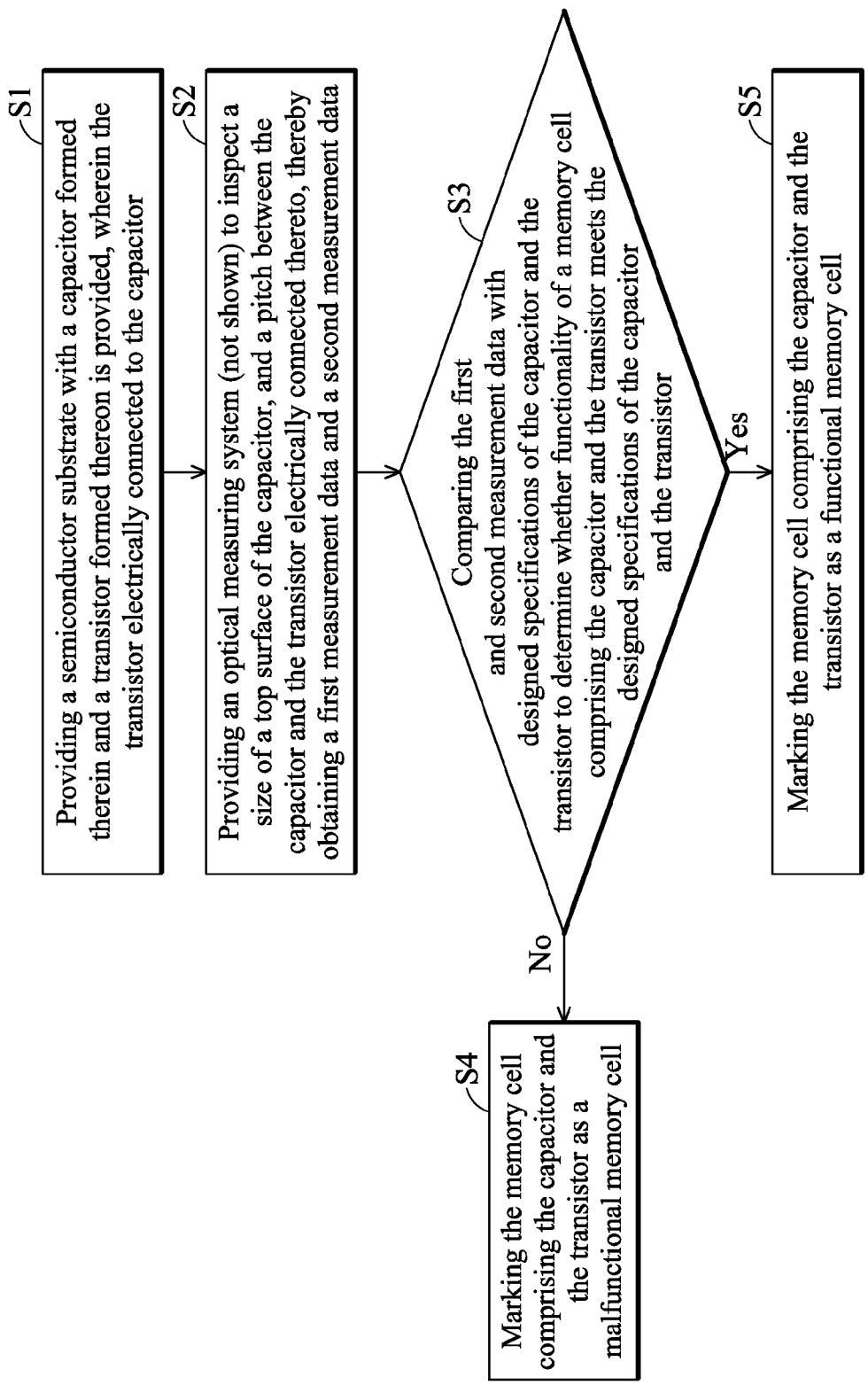
FIG. 3 is a flowchart showing a method of inspecting a memory cell of a DRAM device according to an embodiment of the invention.

However, electrical characteristics such as off-state currents (Ioff) of memory cells of a DRAM device will be problematic since misalignment is formed between the capacitor C and the gate stack G or there exists deformation of the capacitors C in one memory cell. Therefore, a method of in-time inspecting a memory cell of a dynamic random access memory (DRAM) device is provided, as shown with a flowchart in FIG. 3.

The method begins at step S1, a semiconductor substrate with a capacitor formed therein and a transistor formed thereon is provided, wherein the transistor electrically connected to the capacitor. In one embodiment, the semiconductor substrate can be, for example, the semiconductor substrate 100 shown in FIGS. 1-2, and the capacitor can be, for example, one of the capacitors C shown in FIGS. 1-2, and the transistor can be, for example, one of the transistors 150 electrically connected thereto shown in FIGS. 1-2. At this time, the entire top surface the gate stack G of the transistor 150 and most portions of the top surface of the capacitor C are exposed.

Next, in step S2, an optical measuring system (not shown), such as an electron microscopy (EM) is then provided to inspect a size of a top surface of the capacitor C, and a pitch between the capacitor C and the transistor 150 electrically connected thereto, thereby obtaining a first measurement data and a second measurement data. In one embodiment, the first measurement data representing the size of the width of the top surface of the capacitor C is, for example, a relatively smaller width W1 of the capacitor C as shown in FIG. 1, and the second measurement data representing the pitch P1 between the capacitor C and the transistor 150 electrically connected thereto is a pitch P1 between an outer edge of the trench 102 (shown in FIG. 2) of the capacitor C and a side of the gate stack G of the transistor 150 electrically connected thereto, as shown in FIGS. 1-2.

Next, in step S3, the first and second measurement data are then compared with designed specifications of the capacitors C and the transistors 150 to determine whether functionality of a memory cell comprising the capacitor C and the transistor 150 meets the designed specifications of the capacitors C and the transistor 150. If yes, the memory cell comprising the capacitor C and the transistor 150 is then marked as a functional memory cell when the first and second measurement data meet the designed specifications of the capacitor C and the transistor 150, as shown in step S5. If not, the memory cell comprising the capacitor C and the transistor 150 is then marked as a malfunctional memory cell when the first and second measurement data fail to meet the designed specifications of the capacitor C and the transistor 150, as shown in step S4. In one embodiment, the above designed specifications are specifications of photolithography processes for forming the capacitor C and the transistor 150, such as specifications about patterning the trench 102 of the capacitor C and the gate stack G of the transistor 150.

Through the inspection method as described above, an in-time inspection of the functionality of the memory cells of a DRAM device is achieved right after formation of the transistor 150 and the capacitor C of the memory cell prior to formation of interconnect contacts and bitlines thereon.

Figure 4:
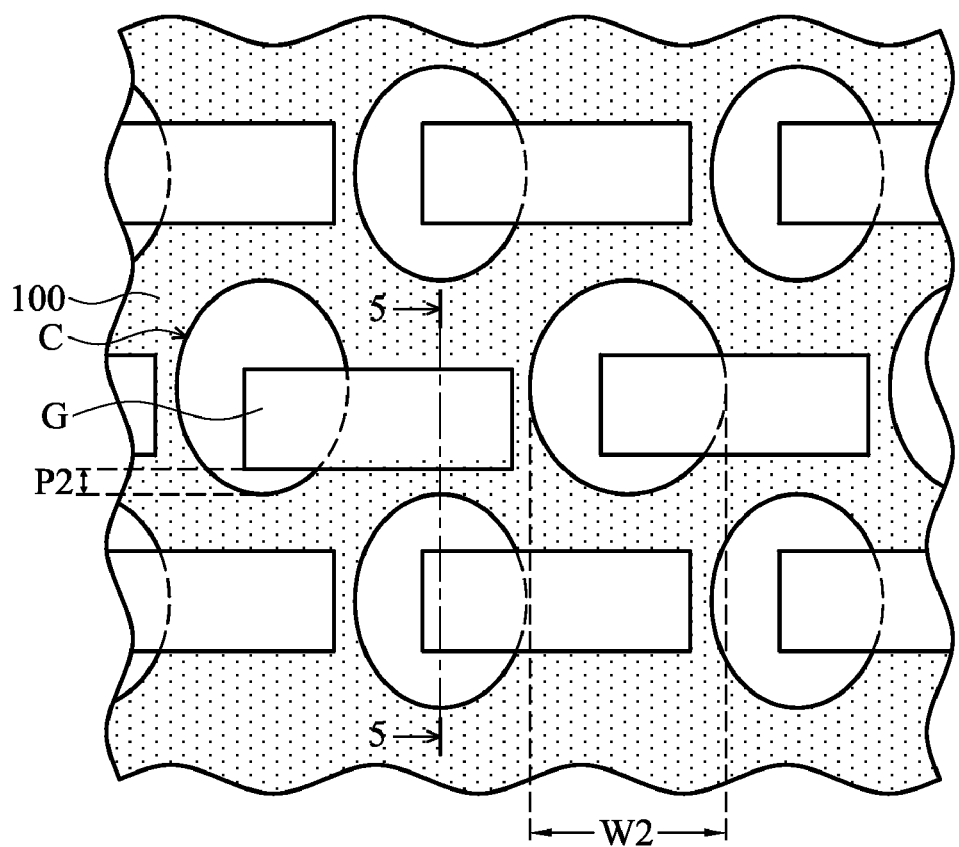
FIG. 4 is a schematic top view of showing a layout of a memory cell array of a dynamic random access memory (DRAM) device according to another embodiment of the invention.

FIG. 4 is a schematic top view of showing a layout of another exemplary memory cell array of a dynamic random access memory (DRAM) device. In this embodiment, the layout shown in FIG. 4 is similar with that shown in FIG. 1 but functionality of one of the memory cells therein is inspected and determined as malfunctioned since the relatively smaller width W2 of the capacitor C in one of the memory cells and a pitch P2 between one of the capacitors C and the gate stack G of one of the transistors 150 electrically connected thereto fail to meet designed specifications for forming the capacitors C and the transistors 150. The defects are caused by deformation of the trench of the capacitors C and/or misalignment between and the capacitor C and the gate stack G of the transistors 150 electrically connected thereto such that electrical characteristics such as off-state currents (Ioff) of the memory cell comprising thereof shown in FIG. 4 become problematic.

Figure 5:
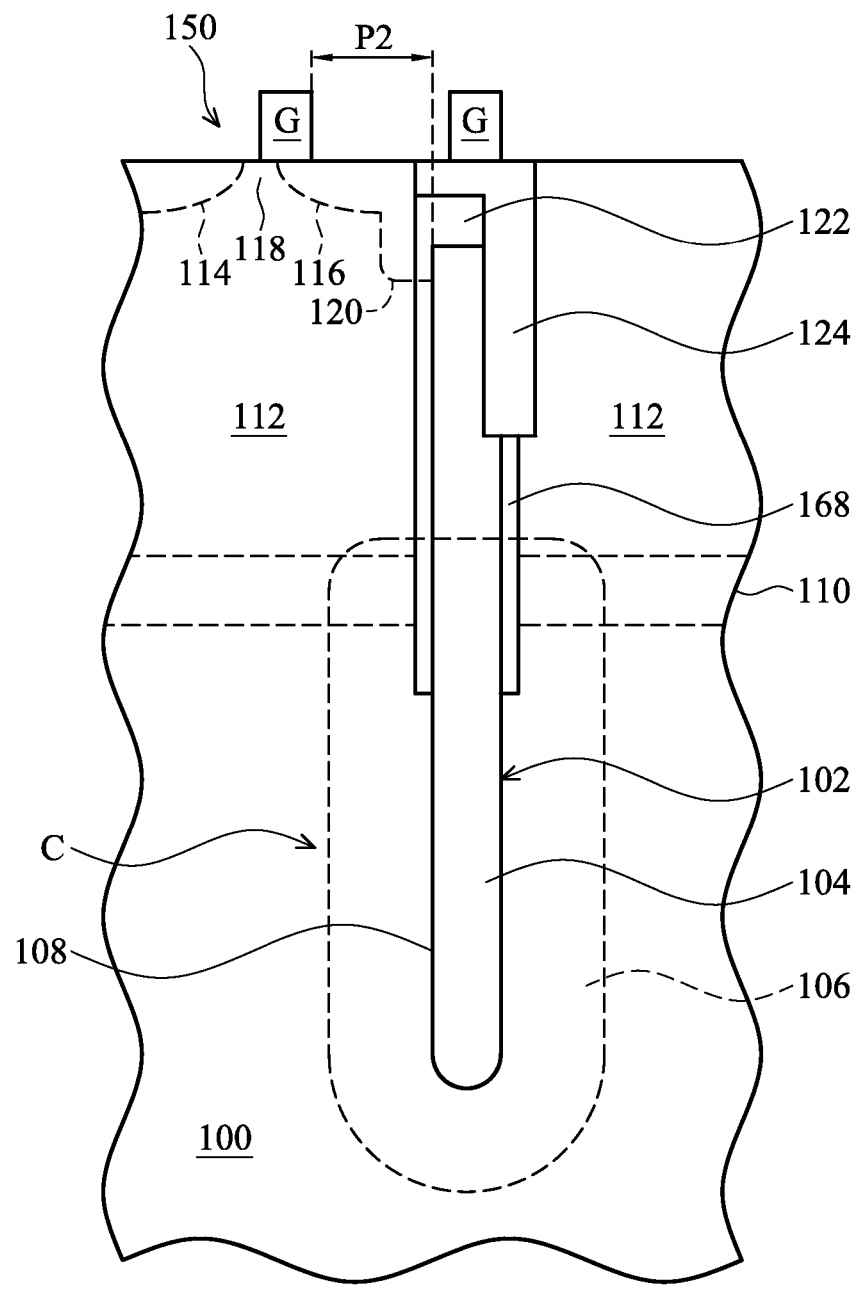
FIG. 5 is a cross sectional view taken along line 5-5 in FIG. 4.

FIG. 5 is a cross sectional view taken along line 5-5 in FIG. 4 showing misalignment between the capacitor C and the gate stack G of the transistor 150 electrically connected of a malfunctioned memory cell, such that the pitch P2 between an outer edge of a trench 102 of the capacitor C and a side of the gate stack G of the transistor 150 electrically connected thereto is smaller than the pitch P1 between an outer edge the capacitor C and a side of the gate stack G of the transistor 150 electrically connected thereto of a functional memory cell as shown in FIG. 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of inspecting a memory cell, comprising:
providing a semiconductor substrate with a capacitor formed therein and a transistor formed thereon, wherein the transistor is electrically connected to the capacitor;
inspecting a size of a top surface of the capacitor and a pitch between the capacitor and the transistor electrically connected thereto by an optical measuring system, thereby obtaining a first measurement data and a second measurement data; and
comparing the first and second measurement data with designed specifications of the capacitor and transistor, thereby determining functionality of a memory cell comprising the capacitor and the transistor.

2. The method as claimed in claim 1, wherein the capacitor is a deep trench capacitor.

3. The method as claimed in claim 1, wherein the size of the top surface of the capacitor is a relatively smaller size of the capacitor.

4. The method as claimed in claim 1, wherein the pitch between the capacitor and the transistor electrically connected thereto is defined as a distance between an outer edge of a trench of the capacitor and a side of the transistor electrically connected thereto.

5. The method as claimed in claim 1, wherein the optical measuring system comprises an electron microscopy.

6. The method as claimed in claim 1, wherein the designed specifications are specifications of photolithography processes for forming the capacitor and the transistor.

7. The method as claimed in claim 1, further comprising marking the memory cell comprising the capacitor and the transistor as a malfunctional memory cell when the first and second measurement data fail to meet the designed specifications of the capacitor and the transistor.

8. The method as claimed in claim 1, further comprising marking the memory cell comprising the capacitor and the transistor as a functional memory cell when the first and second measurement data meet the designed specifications of the capacitor and the transistor.

9. The method as claimed in claim 1, wherein when performing the inspection by the optical measuring system, the entire top surface of a gate stack of the transistor and most portions of the top surface of the capacitor are exposed, and no additional layer is formed thereon.

10. The method as claimed in claim 1, wherein the semiconductor substrate is a silicon substrate.

11. The method as claimed in claim 7, wherein failure of the first measurement data is caused by deformation of a trench of the capacitor.

12. The method as claimed in claim 7, wherein failure of the second measurement data is caused by misalignment between and the capacitor and a gate stack of the transistor.

* * * * *